United States Patent [19]
Fujioka et al.

[11] Patent Number: 6,162,575
[45] Date of Patent: Dec. 19, 2000

[54] PROCESS FOR MAKING LITHOGRAPHIC PRINTING PLATE

[75] Inventors: Hajime Fujioka; Toshiro Kondo, both of Tokyo, Japan

[73] Assignee: Mitsubishi Paper Mills Limited, Tokyo, Japan

[21] Appl. No.: 09/425,057

[22] Filed: Oct. 22, 1999

[30] Foreign Application Priority Data

| Oct. 27, 1998 | [JP] | Japan | 10-305174 |
| Nov. 30, 1998 | [JP] | Japan | 10-339395 |
| Jul. 7, 1999 | [JP] | Japan | 11-192671 |

[51] Int. Cl.[7] ............................... G03F 7/07; G03C 8/06; G03C 8/36
[52] U.S. Cl. ........................ 430/204; 430/249; 430/251; 430/491; 430/492
[58] Field of Search .................... 430/204, 249, 430/251, 491, 492

[56] References Cited

U.S. PATENT DOCUMENTS

| 3,811,888 | 5/1974 | Shibaoka et al. | 430/491 |
| 5,405,730 | 4/1995 | Coppens et al. | 430/231 |
| 5,427,889 | 6/1995 | Saikawa et al. | 430/204 |
| 5,712,076 | 1/1998 | Coppens et al. | 430/204 |
| 5,910,391 | 6/1999 | Kondo et al. | 430/204 |

*Primary Examiner*—Richard L. Schilling
*Attorney, Agent, or Firm*—Pillsbury Madison & Sutro LLP

[57] ABSTRACT

There is disclosed a process for making a lithographic printing plate, which comprises subjecting a lithographic printing material having physical development nuclei between an anodized aluminum support and a silver halide emulsion layer to exposure and then processing the lithographic printing material at least with a developing solution, wherein the developing solution contains an alkaline earth metal.

14 Claims, No Drawings

PROCESS FOR MAKING LITHOGRAPHIC PRINTING PLATE

BACKGROUND OF THE INVENTION

This invention relates to a process for making a lithographic printing plate, more specifically to a process for making a lithographic printing plate using an aluminum plate as a support and utilizing a silver complex diffusion transfer process. With regard to a lithographic printing plate using a silver complex diffusion transfer process (the DTR method), some examples are described on pages 101 to 130 of André Rott and Edith Weyde, "Photographic Silver Halide Diffusion Processes", published by the Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two-sheet type lithographic printing plate is described in detail in Japanese Provisional Patent Publication No. 158844/1982. Also, the mono-sheet type is described in detail in U.S. Pat. No. 3,728,114.

The mono-sheet type lithographic printing plate utilizing the silver complex diffusion transfer process with the use of an aluminum plate as a support (hereinafter referred to as "an aluminum lithographic printing plate") is described in detail in Japanese Provisional Patent Publications No. 118244/1982, No. 158844/1982, No. 260491/1988, No. 116151/1991 and No. 282295/1992, and U.S. Pat. Nos. 4,567,131 and 5,427,889.

In the above-mentioned aluminum lithographic printing plate, physical development nuclei are carried on a roughened and anodized aluminum support, and a silver halide emulsion layer is further provided thereon. A general process for making this lithographic printing plate comprises the steps of exposure, DTR development processing, water washing processing (washing off: removal of a silver halide emulsion layer with washing solution) and finishing processing.

More specifically, a metal silver image portion is formed on the physical development nuclei by the development processing and the silver halide emulsion layer is removed by the subsequent washing processing to expose the metal silver image portion (hereinafter referred to as a "silver image portion") Simultaneously, the anodized aluminum surface itself is exposed as a non-image portion.

After the washing processing, a finishing solution containing a protective colloid such as gum arabic, dextrin, carboxymethyl cellulose, polystyrenesulfonic acid, etc. is coated on the exposed silver image portion and the non-image portion for protecting the same. A processing of the so-called gum coating is applied to the surface of the plate. The finishing solution is also called as a fixing solution and the solution generally contains a compound which makes the silver image portion oleophilic such as a nitrogen-containing heterocyclic compound having a mercapto group or a thione group.

In the above-mentioned aluminum lithographic printing plate, there is a problem that ink removable property is bad at the time of starting printing. In the field of the offset rotary press printer, a printing method which has been used is that an etching by dampening solution is omitted in many cases at the time of starting printing to prevent lack of paper, and after attaching ink on the whole surface of the plate, dampening solution is fed and the ink at the non-image portion is removed. In such a printing, delay in an ink-removing rate at the non-image portion markedly lowers printing efficiency.

Moreover, as a problem in connection with the non-image portion, there is a stain due to a fingerprint. This is a problem that ink is adhered to the fingerprint attached at the non-image portion of the plate surface at the tie of handling the printing plate at printing to cause stain.

Also, as a problem regarding the non-image portion, there is a problem of fine line reproducibility. This is a problem that a fine line image with 100 μm or less cannot be precisely reproduced at the printed material.

Moreover, there is a problem that development latitude is narrow. That is, the problem is that a width of the suitable development time is narrow and when it is out of the range, printing characteristics are markedly lowered.

SUMMARY OF THE INVENTION

An object of the present invention is to provide a developing treatment method of a lithographic printing plate using a silver complex diffusion transfer process in which printing characteristics at the non-image portion and the silver image portion. More specifically, it is to improve ink removable property at the non-image portion and cancel fingerprint stain as well as to improve fine line reproducibility at the silver image portion and printing endurance.

Another object of the present invention is to provide a method of making a lithographic printing plate using a silver complex diffusion transfer process, which has wide development latitude.

The above-mentioned objects of the present invention has been accomplished basically by a process for making a lithographic printing plate, which comprises subjecting a lithographic printing material having physical development nuclei between an anodized aluminum support and a silver halide emulsion layer to exposure and then processing the lithographic printing material at least with a developing solution, wherein said developing solution contains an alkaline earth metal.

DESCRIPTION OF THE PREFERRED EMBODIMENTS

The present invention will be explained in more detail below.

In the present invention, at least one of an alkaline earth metal is contained in the developing solution. By adding the alkaline earth metal to the developing solution, ink removable property at the non-image portion can be improved and fingerprint stain can be prevented, and also, fine line reproducibility at the silver image portion and printing endurance can be improved. Moreover, development latitude can be widened. In particular, by adding the alkaline earth metal to the developing solution, development latitude can be widened by developing the plate so that the decreased amount of aluminum oxide of the aluminum support becomes 0.6 $g/m^2$ or less.

In the present invention, as the alkaline earth metal to be contained in the developing, solution, there may be mentioned calcium, strontium, barium, beryllium, and magnesium. When the alkaline earth metal is to be added to the developing solution, they may be added as a compound as mentioned below. For example, there may be mentioned calcium bromide, calcium carbonate, calcium chloride, calcium citrate, calcium gluconate, calcium hydroxide, calcium iodide, calcium nitrate, calcium nitrite, calcium oxalate, calcium stearate, calcium sulfate, calcium tartarate, barium chlorite, barium perchlorate, barium bromide, barium bromate, barium nitrate, barium sulfate, barium thiosulfate, barium nitrite, beryllium chloride, beryllium bromide, beryllium iodide, beryllium nitrate, magnesium chloride, magnesium perchlorate, magnesium bromide, magnesium iodide, magnesium sulfate, magnesium nitrate, strontium chloride, strontium bromide, strontium nitrate, strontium sulfate, etc. These compounds may be used singly or in combination of two or more and contained in an amount of 1 to 100 mmol/liter, preferably 2 to 100 mmol/liter, more preferably 3 to 80 mmol/liter as the alkaline earth metal in the developing solution. Among the above-mentioned alkaline earth metal, calcium is particularly preferably used. They are preferably added as calcium sulfate, calcium nitrate, calcium chloride and/or calcium hydroxide.

For preparing a developing solution, pure water which was subjected to ion exchange has been generally used, but if a tap water is used, the effect of the present invention cannot be obtained by a minute amount of calcium contained in the tap water. In the present invention, it is important to add an alkaline earth metal such as calcium to the developing solution. An amount thereof is required to be 1 mmol or more per liter of the developing solution.

In the present invention, it is preferred to use the above-mentioned alkaline earth metal and a metal chelating agent in combination. By using these compounds in combination, wide development latitude can be obtained. As the metal chelating agent, there may be mentioned, for example, an hydroxycarboxylic acid such as citric acid and tartaric acid, an aminopolycarboxylic acid, a polyphosphoric acid, a monophosphono(mono, di, or tri)carboxylic acid, a compound having two or more phosphonic acid groups, a salt of the above-mentioned compounds, and the like. These metal chelating agents can be used in an amount within the range of 0.1 to 50, preferably 0.2 to 20 in terms of a molar ratio based on the alkaline earth metal.

In the present invention, it is preferred to use calcium and its chelating agent in combination. As the chelating agent, an amonopolycarboxylic acid, monophosphono(mono, di, or tri)carboxylic acid, a compound having two or more phosphonic acid groups are preferred.

As the aminopolycarboxylic acid and a salt thereof, there may be mentioned, for example, ethylenediaminetetraacetic acid, dihydroxyethylethylenediaminediacetic acid, hydroxyethyliminodiacetic acid, ethylenediamine-N-(β-hydroxyethyl)-N,N',N'-triacetic acid, propylenediaminetetraacetic acid, nitrilotriacetic acid trisodium salt, cyclohexanediaminetetraacetic acid, iminodiacetic acid, dihydroxyethylglycine, ethyl ether diaminetetraacetic acid, ethylenediaminetetrapropionic acid, hydroxyethylethylenediaminetriacetic acid, dihydroxyethylethylenediaminediacetic acid, triethylenetetraminehexaacetic acid, diethylenetriaminepentaacetic acid, glycol ether diaminetetraacetic acid, diaminopropanetetraacetic acid, methylglycinetriacetic acid and the like.

As the monophosphono(mono, di, or tri)carboxylic acid and a salt thereof, there may be mentioned, for example, 1-hydroxy-1-phosphono-ethane-1-carboxylic acid, 1-hydroxy-1-phosphono-ethane-1,2-dicarboxylic acid, 1-hydroxy-1-phosphono-propane-1-carboxylic acid, 1-hydroxy-1-phosphono-propane-1,2,3-tricarboxylic acid, 1-phosphono-ethane-2-carboxylic acid, 1-hydroxy-1-phosphono-ethane-2-carboxylic acid, 2-phosphono-pentane-2,5-dicarboxylic acid, 2-methyl-4-phosphono-butane-1,4-dicarboxylic acid, 2-phosphono-butane-1,4-dicarboxylic acid dipotassium salt, 2,3-dimethyl-2-phosphono-butane-1,4-dicarboxylic acid, 1-phosphono-propane-1,2,3-tricarboxylic acid, 2-phosphono-butane-2,3,4-tricarboxylic acid, and the like.

As the compound having two or more phosphonic acid groups, there may be mentioned, for example, those as mentioned below.

(1)

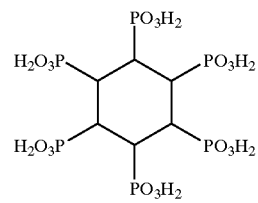

(2)

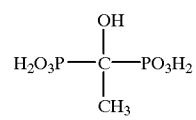

(3)

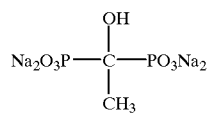

(4)

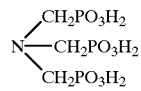

(5)

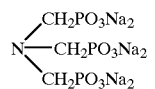

(6)

(7)

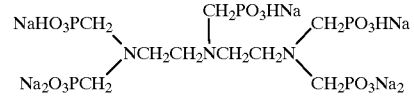

(8)

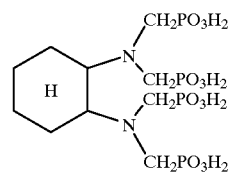

(9)

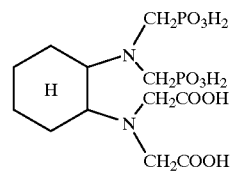

(10)

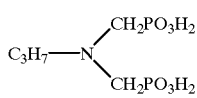
(11)

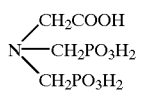
(12)

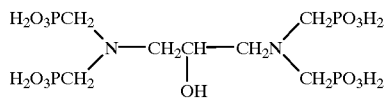
(13)

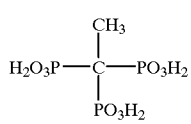
(14)

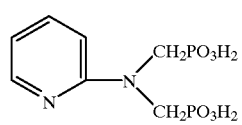
(15)

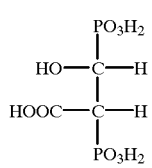
(16)

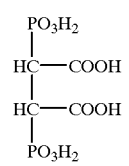
(17)

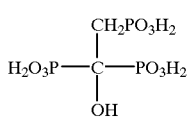
(18)

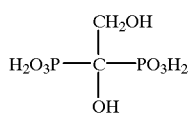
(19)

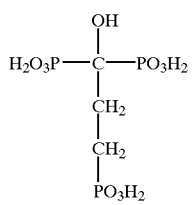
(20)

Among the above-mentioned chelating agents, those having a chelate stability constant to calcium in the range of 5 to 10.5 are preferred, and those having 5 to 10 are more preferred.

In the present invention, by adding the alkaline earth metal to the developing solution, ink removable property at the non-image portion can be improved, fingerprint stain can be removed, and a dissolved out amount of aluminum oxide at the time of developing treatment can be controlled so that development latitude becomes wide and fine line reproducibility at the silver image portion and printing endurance are improved. In the present invention, it is preferred to carry out the developing treatment so that the amount of aluminum oxide decreased by dissolving out from the aluminum support becomes 0.6 g or less per 1 $m^2$ of the lithographic printing plate. More preferably, it is to be selected the conditions of becoming 0.5 g or less, more preferably 0.3 g to 0.0 g.

In the present invention, in order to control the dissolved amount of aluminum oxide from the aluminum support, pH of the developing solution is preferably low, a developing temperature is preferably low, and a developing treatment time is preferably short. More specifically, the pH of the developing solution is generally 10 to 14, but in view of printing characteristics, it is preferably in the range of pH 12.5 or higher, particularly in the range of 12.7 to 13.7. The temperature of the developing solution is preferably about 15 to 30° C. and the development time is preferably about 5 to 30 seconds.

The aluminum support generally used in the present invention is that containing a porous aluminum oxide having a weight of about 1.5 g to 5 g per 1 $m^2$.

The measurement of the total aluminum content can be carried out according to JIS-H-8680-7 "Film weight method" in which an amount of aluminum oxide is measured by dissolving with a bichromic acid aqueous solution. In the present invention, the measurement of the decreased amount of aluminum oxide is carried out by removing light-sensitive layers of an aluminum lithographic printing m aterial with a warm water, etc. to prepare an aluminum support and scraping aluminum oxide at the back surface of the support and weighing the total weight (a) of the support. Then, the support is subjected to development and platemaking treatment, dried, and the total weight (b) of the support is weighed. The difference (a–b) of the weight is made an amount of aluminum oxide dissolved by the developing treatment.

The developing solution to be used in the present invention may contain additives including a developing agent such as a polyhydroxybenzene including hydroquinone, etc., ascorbic acid and its derivatives, a 3-pyrazolidinone including 1-phenyl-3-pyrazolidinone and its derivatives; an alkaline substance such as potassium hydroxide, sodium hydroxide, lithium hydroxide, sodium tertiary phosphate or an amine compound; a preservative such as sodium sulfite; a viscosity modifier such as carboxymethyl cellulose; an antifoggant such as potassium bromide; a development modifier such as a polyoxyalkylene compound; an anionic gelatin coagulant such as a copolymer of a polystyrene-sulfonic acid and maleic anhydride; and a silver halide solvent such as a compound as mentioned below.

As the silver halide solvent to be used in the present invention, there may be mentioned, for example, a thiosulfate such as sodium thiosulfate, potassium thiosulfate, ammonium thiosulfate, etc.; a sulfite such as sodium sulfite and potassium hydrogen sulfite; an iodide such as potassium iodide and sodium iodide; 2-mercaptobenzoic acid and derivatives thereof; a cyclic imide such as uracil; an alkanolamine; a diamine; a mesoionic compound; and a thioether, etc.

Among these silver halide solvents, a thiosulfate, an alkanolamine, a mesoionic compound and a thioether compound are particularly preferred.

The thiosulfate is preferably contained in an amount of 0.04 mol or more per liter of the developing solution. It is more preferably contained in the range of 0.04 mol to 0.15 mol, further preferably 0.05 mol to 0.12 mol.

As the alkanolamine, there may be mentioned, for example, 2-(2-aminoethylamino)ethanolamine, diethanolamine, N-methylethanolamine, triethanolamine, N-ethyldiethanolamine, diisopropanolamine, monoethanolamine, 4-aminobutanol, N,N-dimethylethanolamine, 3-aminopropanol, N,N-ethyl-2,2'-iminodiethanol, 2-methylaminoethanol, 2-amino-2-methyl-1-propanol and the like. An amount of the alkanolamine to be added is preferably 0.005 mol to 1.5 mol, more preferably 0.01 mol to 1.0 mol per liter of the developing solution.

The mesoionic compound to be used in the present invention may be mentioned those as disclosed in Japanese Provisional Patent Publications No. 328559/1992, No. 160248/1997 and No. 171257/1997. An amount of the mesoionic compound may vary depending on the various conditions, but generally within the range of 0.1 g to 10 g, preferably 0.1 g to 5 g per liter of the developing solution.

As the thioether compound, those as disclosed in U.S. Pat. No. 5,200,294 and Japanese Provisional Patent Publication No. 282674/1998 may be mentioned. An amount of the thioether compound is preferably within the range of 0.01 g to 20 g, more preferably 0.1 g to 10 g per liter of the developing solution.

Among the above-mentioned silver halide solvents, it is particularly preferred to use the thiosulfate and alkanolamine in combination.

It is preferred to further contain a compound (oleophilic agent) to make the silver image portion oleophilic. As the oleophilic agent, compounds as disclosed on pages 105 and 106 of André Rott and Edith Weyde, "Photographic Silver Halide Diffusion Processes", published by the Focal Press, London and New York (1972) may be mentioned. For example, a compound having a mercapto group and a thoine group, a quaternary ammonium compound and the like may be mentioned, and a compound having a mercapto group and a thoine group is preferably used in the present invention. A particularly preferred compound is a nitrogen-containing heterocyclic ring compound having a mercapto group and a thione group, which is disclosed in Japanese Patent Publication No. 29723/1973 and Japanese Provisional Patent Publication No. 12928/1983. In the following, specific examples thereof may be mentioned, but the invention is not limited by them.

Specific examples of such a compound may include 2-mercapto-4-phenylimidazole, 2-mercapto-1-benzylimidazole, 2-mercapto-benzimidazole, 1-ethyl-2-mercapto-benzimidazole, 2-mercapto-1-butyl-benzimidazole, 1,3-diethyl-benzoimidazolin-2-thione, 1,3-dibenzyl-imidazolidin-2-thione, 2,2'-dimercapto-1,1'-decamethylene-diimidazoline, 2-mercapto-4-phenylthiazole, 2-mercapto-benzothiazole, 2-mercatonaphthothiazole, 3-ethyl-benzothiazolin-2-thione, 3-dodecyl-benzothiazolin-2-thione, 2-mercapto-4,5-diphenyloxazole, 2-mercaptobenzoxazole, 3-pentyl-benzoxazolin-2-thione, 1-phenyl-3-methylpyrazolin-5-thione, 3-mercapto-4-allyl-5-pentadecyl-1,2,4-triazole, 3-mercapto-5-nonyl-1,2,4-triazole, 3-mercapto-4-acetamido-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 2-heptadecyl-5-phenyl-1,3,4-oxadiazole, 5-mercapto-1-phenyl-tetrazole, 2-mercapto-5-nitropyridine, 1-methyl-quinolin-2(1H)-thione, 3-mercapto-4-methyl-6-phenyl-pyridazine, 2-mercapto-5,6-diphenyl-pyrazine, 2-mercapto-4,6-diphenyl-1,3,5-triazine, 2-amino-4-mercapto-6-benzyl-1,3,5-triazine, 1,5-dimercapto-3,7-diphenyl-S-triazolino[1,2-a]-S-triazoline, etc. An amount of the above-mentioned oleophilic agent to be added to the developing solution is preferably 0.01 to 10 g/liter.

In the present invention, a washing treatment is applied to subsequent to the developing treatment. Between the developing treatment and the washing treatment, a neutralization-stabilization treatment to stop the progress of the development may be applied. In the neutralizing solution, the above-mentioned oleophilic agent may be contained.

The above-mentioned washing solution is used to completely wash off the silver halide emulsion layer(s) on the aluminum support. A method of spraying the washing solution at 25 to 35° C. with the jet system or a method of peeling the silver halide emulsion layer(s) by a scrub roller while spraying the washing solution is generally employed.

In the aluminum lithographic printing plate, removal of the silver halide emulsion layer(s) by washing is an extremely important step for completely exposing the silver image portion and the non-image portion constituted by the aluminum surface itself. In particular, the silver image portion which accepts ink is required to be strongly oleophilic, and any substance which prohibits oleophilic property such as gelatin on the surface thereof shall be completely removed.

The washing solution to be used in the present invention is preferably adjusted to pH 4 to 9. To the washing solution, the above-mentioned oleophilic agent, a preservative, a proteinase (for example, pepsin, rennin, trypsin, chymotrypsin, cathepsin, papain, ficin, thrombin, renin, collagenase, bromelain and bacterioproteinase, etc.), and the like may be further added.

The washing solution is preferably not to contain phosphoric acid or a salt thereof, or even when it is contained, the amount is limited to 50 mmol/liter or less. Here, the phosphoric acid means ortho phosphoric acid and its salt. It has been disclosed to contain phosphoric acid in the washing solution as in Japanese Provisional Patent Publications No. 216236/1993, No. 198037/1988and No. 301287/1998, and U.S. Pat. No. 5,196,290, etc. In the process for making a lithographic printing plate of the present invention, when the washing solution contains phosphoric acid, ink receptivity tends to be lowered in the running processing (a number of lithographic printing plates are processed with the same processing solution continuously or discontinuously). Accordingly, it is preferred not to contain phosphoric acid in the washing solution or even when it is contained, the amount is limited to 50 mmol/liter or less, more preferably 0 to 30 mmol/liter. This is because a hydrophilic alkaline earth metal salt of phosphoric acid (for example, calcium phosphate) is formed during the processing procedure and remained at the silver image portion which is not sufficiently made oleophilic whereby the ink receptivity is supposed to be inhibited.

In the washing solution, an amine compound is preferably contained. As the amine compound, any amines such as an aliphatic amine, an aromatic amine, etc., but an alkanolamine is particularly preferred. As the alkanolamine, there may be mentioned, for example, 2-(2-aminoethylamino)

ethanolamine, diethanolamine, N-methylethanolamine, triethanolamine, N-ethyldiethanolamine, diisopropanolamine, monoethanolamine, 4-aminobutanol, N,N-dimethylethanolamine, 3-aminopropanol, N,N-ethyl-2,2'-iminodiethanol, 2-methylaminoethanol, 2-amino-2-methyl-1-propanol and the like, which may be used singly or in combination of two or more. It is particularly preferred to use a secondary alkanolamine or tertiary alkanolamine. An amount of the alkanolamine to be added is preferably 1 to 100 g, more preferably 3 to 60 g per liter of the developing solution.

In the present invention, particularly preferred washing solution contains an alkanolamine compound and an acid compound, and having a pH of 5 to 8, and containing substantially no phosphoric acid or a salt thereof. Here, the phrase "containing substantially no phosphoric acid or a salt thereof" means 50 mmol or less per liter of the washing solution even when it is contained as mentioned above.

The washing solution containing the above-mentioned amine compound preferably contains an acid other than the phosphoric acid or a salt thereof (phosphoric acid, and an alkali metal or ammonium salt of a primary, secondary and tertiary phosphoric acid) to adjust a pH to 4 to 9, more preferably to 5 to 8. As the acid, there may be used either of an organic acid such as citric acid, or an inorganic acid such as phosphonic acid, or may be used in combination of two or more. Or else, it may be in the form of a salt.

An amount of the acid or a salt thereof may vary depending on the pH of the desired washing solution, kinds and amounts of an acid and amine compounds, but preferably 0.5 to 100 g, more preferably 1 to 50 g per liter of the washing solution.

In the present invention, the washing solution preferably contains an acid compound having a phosphonic acid group in the molecule. As the phosphonic acid compound, those having two or more phosphonic acid groups as mentioned above can be exemplified.

The above-mentioned phosphonic acid compound also has an effect of preventing occurrence of precipitates (mainly comprising components such as magnesium, calcium, aluminum, etc.) adhered to a roller of the processing device.

In the process for making a lithographic printing plate of the present invention, the silver image portion and the non-image portion exposed by the above-mentioned washing treatment is subjected to a treatment by the finishing solution for the purpose of heightening oleophilicity and hydrophilicity of the respective portions and for protecting the plate surface. In the present invention, the finishing solution preferably contains a protective colloid such as gum arabic, dextrin, sodium alginate, alginic acid propylene glycol ester, hydroxyethyl starch, carboxymethyl cellulose, hydroxyethyl cellulose, polyvinyl pyrrolidone, polystyrene sulfonic acid, polyvinyl alcohol, etc. in order to protect and to improve hydrophilicity of the anodized layer at the non-image portion. Also, in order to further improve oleophilicity at the image portion, the above-mentioned oleophilic agent is preferably contained. Moreover, the above-mentioned proteinase may be further contained.

The lithographic printing plate which is a subject of the present invention has physical development nuclei and at least one of a silver halide emulsion layer on an aluminum support. The silver halide emulsion is selected from the group consisting of generally employed silver chloride, silver bromide, silver iodide, silver chlorobromide and silver iodobromide, etc., but preferably comprises silver chloride (which means an emulsion containing 50 mol % or more of silver chloride). Also, as the type of the emulsion, it may be a negative type or a positive type. These silver halide emulsions may be chemically sensitized or spectrally sensitized depending on necessity.

As the hydrophilic colloid of the silver halide emulsion layer, gelatin is preferably used for preparing silver halide particles. As the gelatin, there may be used various kinds of gelatins such as acid-treated gelatin and alkali-treated gelatin. Also, modified gelatins thereof (e.g., phthalated gelatin and amidated gelatin) can be used. Further, a hydrophilic high molecular weight compound such as polyvinyl pyrrolidone, various starches, albumin, polyvinyl alcohol, gum arabic and hydroxyethyl cellulose can be contained. As the hydrophilic colloid to be used, a hydrophilic colloid substantially containing no hardener is desirably used in order to facilitate peeling of the silver halide emulsion layer after development.

In the silver halide emulsion layer of the lithographic printing plate according to the present invention, various kinds of surfactants such as anion, cation, betaine, and nonion type surfactants; a film thickening agent such as carboxymethyl cellulose, etc.; a coating aid such as a defoaming agent; a chelating agent such as ethylenediaminetetraacetate; a developing agent such as hydroquinone, polyhydroxybenzenes, 3-pyrazolidinones, etc., may be added.

In the process for making a lithographic printing plate by developing a solution containing an alkaline earth metal of the present invention, it is preferred to carry out the development in the presence of a tetrazole compound having a mercapto group. By using such a compound, stable printing endurance, good image reproducibility and ink receptivity can be obtained.

The tetrazole compound having a mercapto group is so provided that it is present in at least one of the constitutional layers such as a physical development nuclei layer and a silver halide emulsion layer of the lithographic printing plate material and the developing solution. The above-mentioned tetrazole compound having a mercapto group is a tetrazole compound having a mercapto group and a hydrocarbon group having 3 or more carbon atoms (for example, unsubstituted or substituted alkyl group, aryl group, etc.). More specifically, there may be mentioned, for example, 1-phenyl-5-mercaptotetrazole, 1-hexyl-5-mercaptotetrazole, 1-hexylaminocarbonylmethyl-5-mercaptotetrazole, 1-dibutylaminoethyl-5-mercaptotetrazole, 1-dibutylaminocarnonylmethyl-5-mercaptotetrazole, and the like.

An amount to be used of the above-mentioned tetrazole compound having a mercapto group is $1 \times 10^{-5}$ mol to $5 \times 10^{-3}$ mol, preferably $2 \times 10^{-5}$ mol to $3 \times 10^{-3}$ mol per 1 $m^2$ when it is contained in at least one layer of the constitutional layers such as a silver halide emulsion layer or a physical development nuclei layer of the lithographic printing plate material, or an intermediate layer or a protective layer provided depending on necessity, and is $2 \times 10^{-5}$ mol to $1 \times 10^{-2}$ mol, preferably $1 \times 10^{-4}$ mol to $5 \times 10^{-3}$ mol per liter when it is contained in the developing solution.

As the physical development nuclei of the physical development nuclei layer to be used in the present invention, those well known in the silver complex diffusion transfer method are used, and, for example, a metal sulfide in which colloid such as gold, silver, etc., or a water-soluble salt of palladium, zinc, etc. and a sulfide are mixed. As the protective colloids, various kinds of hydrophilic colloids may be used. With respect to details thereof and preparation process of the same, reference can be made to, for example, Japanese Patent Publication No. 30562/1973, Japanese Provisional Patent Publications No. 55402/1973 and No. 21602/1978, and André Rott and Edith Weyde, "Photographic Silver Halide Diffusion Processes", published by the Focal Press, London and New York (1972). In the present invention, a water-swellable intermediate layer as disclosed in Japanese Provisional Patent Publication No. 116151/1991 and/or an intermediate layer containing hydrophobic polymeric beads as disclosed in Japanese Provisional Patent Publication No. 282295/1992 may be provided between the physical development nuclei layer and the silver halide emulsion layer.

The aluminum support to be used in the present invention is explained below. As the aluminum plate, pure aluminum and an aluminum alloy plate containing a small amount of various kinds of metal(s) such as silicon, magnesium, iron, copper, zinc, manganese, chromium, titanium, etc. may be used.

For making the above-mentioned aluminum plate a support for the lithographic printing plate, a surface treatment is applied thereto before coating a light-sensitive layer. In the surface treatments, degreasing, roughening, desmutting, anodizing, and, if necessary, other various treatment as the post-treatment are generally carried out. These treatments are generally carried out continuously by using an aluminum coil, and after the respective treatments, washing is carried out depending on the necessity and then dried to obtain a support. The processing speeds of the respective treatments are not particularly limited.

Aluminum is generally an active metal and an oxide film is naturally formed with a thickness of 1 to several nm on the surface thereof in air. However, an alkaline resistance of the film itself is poor, and thus, an aluminum oxide layer (anodized film) is formed to improve the alkaline resistance. In the support for the lithographic printing plate, porous anodized film is formed as an anodized film to improve water retention property of the surface and to improve adhesiveness with the light-sensitive layer. When the thickness of the anodized film is thick, the alkaline resistance becomes good, but if the thickness is made thick, a cost for power is increased, productivity is lowered and printing stain is easily occurred. Thus, in the present invention, an aluminum support with the aluminum oxide (anodized film) weight of preferably 3.5 g/m$^2$ or less, more preferably 3 g/m$^2$ or less, particularly preferably 2.5 g/m$^2$ or less is used.

In the case of such a porous anodized oxide film, the thickness of the barrier layer at the bottom portion of the formed micropore affects the alkaline resistance. When the barrier layer is made thick, the alkaline resistance can be improved but the barrier layer is made thick, secondary electrolysis such as a pore-filling treatment, etc. is required after anodization whereby the preparation cost becomes high. Accordingly, in the present invention, it is preferred to use an aluminum support having a barrier layer thickness of 25 nm or less, more preferably 20 nm or less.

Further, it is desired to enlarge the ratio of the aluminum oxide amount based on the surface roughness (Ra) to prevent etch pit. However, in the case of a support having a large surface roughness, the thickness of an anodized film shall be made thick so that increase in a power cost and decrease in productivity are caused as mentioned above. Thus, in the present invention, it is preferred to use an aluminum support having the ratio of the aluminum oxide amount based on the surface roughness being preferably 8 or less, particularly preferably 6 or less.

As described above, it is preferred to make the anodized film thin in the point of a cost, but there is a problem that development latitude becomes contrarily narrower. However, in the present invention, by adding an alkaline earth metal to the developing solution, the above-mentioned problems can be solved whereby the plate can be manufactured with a low cost.

Also, as a preferred surface state of the aluminum support to be used in the present invention, those as disclosed in U.S. Pat. No. 5,427,889 or U.S. Pat. No. 5,405,730.

The aluminum support disclosed in the former U.S. Pat. No. 5,427,889 is an aluminum support in which 500 or more of pits having a diameter of 0.03 to 0.30 μm are present per 100 μm$^2$, and an average diameter of these pits is 0.05 to 0.20 μm. The number of pits having a diameter of 0.03 to 0.30 μm is preferably about 1,000 or more per 100 μm$^2$, and the upper limit is preferably up to 15,000. An average diameter of the pits having a diameter of 0.03 to 0.30 μm is preferably 0.05 to 0.15 μm. With regard to the diameter of the pits, the diameter of the pits having a shape other than circular is a diameter regarded as a circular shape. A center depth of the pits is preferably ⅓ (0.01 to 0.1 μm) or more, more preferably about ½ (0.01 to 0.1 μm) to about 3 (0.09 to 0.9 μm) based on the diameter of the pits. A whole projected surface area of these fine pits is preferably about 5 to 50%.

The aluminum support disclosed in the latter U.S. Pat. No. 5,405,730 is an aluminum support in which the sum of the surface areas of subsidences amounts is at least 50% of the theoretical surface of the grained aluminum support. In such a support, a subsidence is a section of the real surface of the grained and anodized side of said support having continuously a depth of at least 0.5 μm, a protuberance is a section of the real surface of the grained and anodized side of said support having continuously a depth of less than 0.5 μm. The depths are measured perpendicular to the theoretical surface of the grained and anodized side of said support. The surface area of a subsidence or a protuberance is equated with the area of a circle having as diameter the distance between the intersection of the real surface and lines, being parallel with but 0.5 μm beneath said theoretical surface.

The sum of the surface areas of subsidences amounts is preferably at least 75% of the theoretical surface area, particularly preferably at least 90%. The subsidences preferably have a maximum depth of at least 1 μm, particularly preferably a maximum depth of at least 2 μm.

By treating the lithographic printing material using the aluminum support having a surface shape as mentioned above with the developing solution containing an alkaline earth metal, improvement in printing endurance can be accomplished.

EXAMPLES

In the following, the present invention is explained by referring to Examples by which the present invention is not limited.

Example 1

According to the method as disclosed in U.S. Pat. No. 5,427,889 which is incorporated as a reference herein, electrolytic roughening treatment and anodization of an aluminum support were carried out to obtain an aluminum support having a thickness of 0.30 mm to which pits with a diameter of 0.03 to 0.30 μm had been formed with about 5,600 per 100 μm$^2$ on a plateau with an average diameter of about 5 μm, and the pit has an average diameter of 0.08 μm. This aluminum support was subjected to anodization after the surface roughening treatment, and had an amount of aluminum oxide of 2.5 g/m² and an average roughness (Ra) measured by JIS B 0601 (1994) of 0.5 μm.

On the aluminum support, a physical development nuclei solution comprising a sol solution of palladium sulfide nuclear containing a small amount of a binder was coated and then dried. An amount of palladium sulfide contained in a physical development nuclei layer was 3 mg/m².

As a protective colloid, alkali-treated gelatin was used. As a silver halide emulsion, a silver chloroiodobromide emulsion containing 15 mol % of silver bromide and 0.4 mol % of silver iodide, and having an average particle size of 0.2 μm, with which 0.006 mmol of potassium hexachloroiridate (IV) per mole of silver was doped, was prepared by the control double jet method. Thereafter, the emulsion was subjected to flocculatoin and washed. Moreover, after sulfur-gold sensitization was applied to the emulsion, a stabilizer was added thereto, and then, spectrally sensitized by using 3 mg of a sensitizing dye represented by the following formula (A) per 1 g of silver.

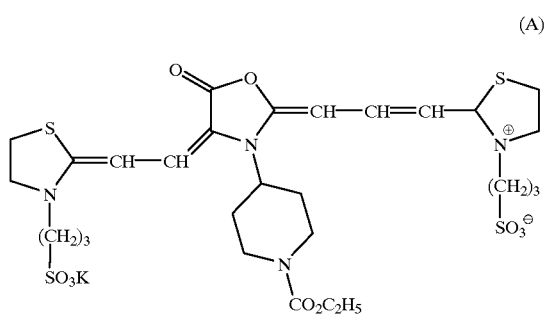

(A)

A surfactant was added to the thus prepared silver halide emulsion to prepare a coating solution. This coating solution for an emulsion layer was coated on the aluminum support on which the above-mentioned physical development nuclei had been coated, so that an amount of silver became 2 g/m² and a gelatin amount of 2.5 g/m², followed by drying to obtain a lithographic printing material sample.

On the thus prepared lithographic printing material, an image was outputted by an output machine having a red LD laser at 633 nm as a light source. Then, the lithographic printing material was processed by a processor for plate making (SLT-85N (trade name) automatic processor, available from Du'Pont) to obtain a lithographic printing plate. The processor for plate making is constituted by a step of development processing (22° C., 15 seconds soaking), a step of washing processing (washing off the emulsion layer by a scrub roller while showering and jetting a washing solution at 35° C. for 10 seconds), a step of finishing processing (21° C., 5 seconds showering) and a drying step.

Developing solutions A and B having the following compositions were used.

| Sodium hydroxide | 25 g |
|---|---|
| Copolymer of polystyrenesulfonic acid and maleic anhydride (Average molecular weight: 500,000) | 10 g |
| Ethylenediaminetetraacetic acid sodium salt | 2 g |
| Anhydrous sodium sulfite | 100 g |
| Monomethylethanolamine | 50 g |

-continued

| 2-Mercapto-5-n-heptyl-oxadiazole | 0.5 g |
|---|---|
| Sodium thiosulfate (pentahydrate) | 8 g |
| Hydroquinone | 15 g |
| 1-Phenyl-3-pyrazolidinone | 2 g |

Make up to 1,000 ml with addition of deionized water. A pH (25° C.)=13.1.
<Developing Solution B>

Calcium sulfate was added to the above-mentioned Developing solution A so that an amount of calcium becomes 7 mmol.

Compositions of a washing solution and a finishing solution used in the processing are shown below.
<Washing Solution>

| 2-Mercapto-5-n-heptyl-oxadiazole | 0.5 g |
|---|---|
| Monoethanolamine | 13 g |
| Sodium bisulfite | 10 g |
| Potassium primary phosphate | 40 g |
| Proteinase | 1 g |

Make up to 1,000 ml with addition of deionized water. A pH was adjusted to 6.0.

As a proteinase, Bioprase AL-15 (trade name, bacterioproteinase, available from Nagase Sangyo K. K.) was used.
<Finishing Solution>

| Phosphoric acid | 0.5 g |
|---|---|
| Monoethanolamine | 5.0 g |
| 2-Mercapto-5-n-heptyl-oxadiazole | 0.5 g |
| Polyglycerose (hexamer) | 50 g |

Make up to 1,000 ml with addition of deionized water. A pH was adjusted to 7.2.

By using the developing solution A or B, lithographic printing plates were prepared. With regard to these lithographic printing plates, ink removable property was measured. The ink removable property was evaluated by mounting the lithographic printing plate on an offset rotaryprinting press, after placing ink on the plate surface, dampening solution was fed, and a number of sheets until disappearing ink stain at the non-image portion was counted. As a result, the lithographic printing plate prepared by using the developing solution A required about 100 sheets until disappearing ink stain but the lithographic printing plate prepared by using the developing solution B of the present invention required only 20 sheets.

Moreover, with regard to the above lithographic printing plates, fingerprint stain was also evaluated. After attaching fingerprint to the non-image portion of the plate surface by compulsorily pressing a finger against the same, the plates were allowed to stand one day. With respect to these lithographic printing plates, printing was each carried out by using a printer Heidelberg TOK (trade name, an offset printing press manufactured by Heidelberg Co.), ink (New Champion Black H, trade name, produced by Dainippon Ink Co., Japan) and commercially available dampening solution for a PS plate, and fingerprint stain was evaluated. As a result, at the non-image portion of the printed material printed by the lithographic printing plate prepared by using the developing solution A, clear fingerprint stain was admitted, but in the lithographic printing plate prepared by using the developing solution B of the present invention, completely no stain was admitted.

Example 2

By using the developing solution C as mentioned below, the same tests as in Example 1 were carried out.
<Developing Solution C>

| Sodium hydroxide | 30 g |
| Copolymer of polystyrenesulfonic acid and maleic anhydride (Average molecular weight: 500,000) | 10 g |
| Ethylenediaminetetraacetic acid sodium salt | 2 g |
| Anhydrous sodium sulfite | 100 g |
| Monomethylethanolamine | 50 g |
| 2-Mercapto-5-n-heptyl-oxadiazole | 0.5 g |
| Sodium thiosulfate (pentahydrate) | 8 g |
| Hydroquinone | 15 g |
| 1-Phenyl-3-pyrazolidinone | 3 g |
| Calcium sulfate | 22 mmol |
| Aminotri(methylenephosphonic acid) | 10 g |

Make up to 1,000 ml with addition of deionized water. A pH (25° C.)=13.1.

By using the developing solution C of the present invention, a lithographic printing plate was prepared. With regard to the lithographic printing plate, printing tests were carried out in the same manner as in Example 1. As a result, ink removable property was markedly improved as 10 sheets and no problem was observed in fingerprint stain.

Next, with regard to the printing plate prepared by using the developing solution C of the present invention and the printing plate prepared by using the Comparative developing solution A in Example 1, fine line reproducibility was tested by the method as mentioned below. By using an output machine having a red LD laser used in Example 1, register marks for registering (register marks comprising fine lines having 80 μm) were simultaneously outputted at the time of outputting an image at the four corners of the printing plate. With respect to these lithographic printing plates, printing was each carried out by using a printer Heidelberg TOK (trade name, an offset printing press manufactured by Heidelberg Co.) in the same manner as in Example 1, in the present invention, register marks can be clearly reproduced in the printed material. However, in the comparative sample, register marks were not printed in the printed material.

Example 3

Developing solutions D and E as mentioned below were prepared.
<Developing Solution D>

Barium sulfate was added to the above-mentioned Developing solution A so that an amount of barium becomes 7 mmol.
<Developing Solution E>

Magnesium nitrate was added to the above-mentioned Developing solution A so that an amount of magnesium becomes 7 mmol.

The same tests as in Example 1 were carried out except for using the above-mentioned developing solution D or E. As a result, with regard to ink removable property, both of the printing plates prepared by using the developing solution D and the developing solution E were about 40 sheets or so, which is slightly inferior to the result of using the developing solution B to which calcium is added, but is markedly superior to the result of using the comparative developing solution A.

With regard to fingerprint stain, the printing plates prepared by using the developing solutions D and E showed slight stain but highly improved effects could be admitted as compared with the printing plates prepared by using the comparative developing solution A.

Example 4

An aluminum support having a thickness of 0.30 mm which had been subjected to electrolytic roughening treatment and anodization was obtained. This aluminum support had a porous aluminum oxide (an anodized film) in an amount of 2.2 g and had an average roughness (Ra) of the surface of 0.5 μm.

On the aluminum support, a physical development nuclei solution comprising a sol solution of palladium sulfide nuclear containing a small amount of a binder was coated and then dried. An amount of palladium sulfide contained in a physical development nuclei layer was 3 mg/m$^2$.

As a protective colloid, alkali-treated gelatin was used. As a silver halide emulsion, a silver chloroiodobromide emulsion containing 20 mol % of silver bromide and 0.3 mol % of silver iodide, and having an average particle size of 0.25 μm, with which 0.006 mmol of potassium hexachloroiridate (IV) per mole of silver was doped, was prepared by the control double jet method. Thereafter, the emulsion was subjected to flocculation and washed. Moreover, after sulfur-gold sensitization was applied to the emulsion, a stabilizer was added thereto, and then, spectrally sensitized by using 3 mg of a sensitizing dye which is red-color light-sensitive per 1 g of silver.

A surfactant was added to the thus prepared silver halide emulsion to prepare a coating solution. This coating solution for an emulsion layer was coated on the aluminum support on which the above-mentioned physical development nuclei had been coated, so that an amount of silver became 2 g/m$^2$ and a gelatin amount of 2.5 g/m$^2$, followed by drying to obtain a lithographic printing material sample.

On the thus prepared lithographic printing material, an image was outputted by an output machine having a red LD laser at 633 nm as a light source. Then, the lithographic printing material was processed by a processor for plate making (SLT-85N (trade name) automatic processor, available from Du'Pont) to obtain a lithographic printing plate. Plates were made by changing the development treating time to 8 seconds and 16 seconds, through a step of washing processing (washing off the emulsion layer by a scrub roller while showering and jetting a washing solution at 35° C. for 10 seconds), a step of finishing processing (21° C., 5 seconds showering) and a drying step.

Developing solutions F, G and H having the following compositions were used.
<Developing Solution F> (Comparative purpose)

| Sodium hydroxide | 30 g |
| Copolymer of polystyrenesulfonic acid and maleic anhydride (Average molecular weight: 500,000) | 10 g |
| Ethylenediaminetetraacetic acid sodium salt | 2 g |
| Anhydrous sodium sulfite | 100 g |
| Monomethylethanolamine | 50 g |
| 2-Mercapto-5-n-heptyl-oxadiazole | 0.5 g |
| Sodium thiosulfate (pentahydrate) | 8 g |
| Hydroquinone | 15 g |
| 1-Phenyl-3-pyrazolidinone | 3 g |

Make up to 1,000 ml with addition of deionized water. A pH (25° C.)=13.3.

<Developing Solution G>

| Sodium hydroxide | 30 g |
| Copolymer of polystyrenesulfonic acid and maleic anhydride (Average molecular weight: 500,000) | 10 g |
| Anhydrous sodium sulfite | 100 g |
| Monomethylethanolamine | 50 g |
| 2-Mercapto-5-n-heptyl-oxadiazole | 0.5 g |
| Sodium thiosulfate (pentahydrate) | 8 g |
| Hydroquinone | 15 g |
| 1-Phenyl-3-pyrazolidinone | 3 g |
| Calcium sulfate | 7 mmol |
| Aminotri(methylenephosphonic acid) | 5 g |

Make up to 1,000 ml with addition of deionized water. A pH (25° C.)=13.3.

<Developing Solution H>

The same composition as in Developing solution G except for changing the amount of sodium thiosulfate (pentahydrate) to 20 g (0.08 mol).

Compositions of a washing solution and a finishing solution used in the processing are shown below.

<Washing Solution>

| 2-Mercapto-5-n-heptyl-oxadiazole | 0.5 g |
| Monoethanolamine | 13 g |
| Sodium bisulfite | 10 g |
| Proteinase | 1 g |

Make up to 1,000 ml with addition of deionized water. A pH was adjusted to 6.0.

As a proteinase, Bioprase AL-15 (trade name, bacterioproteinase, available from Nagase Sangyo K. K.) was used.

<Finishing Solution>

The same finishing solution as used in Example 1.

When the above-mentioned lithographic printing materials were subjected to developing treatment at 22° C. for 8 seconds or 16 seconds by using the developing solution F, G or H, decreased amounts of the aluminum oxide per 1 m² were 0.8 g (8 seconds) and 1.1 g (16 seconds) in the developing solution F, and 0.3 g (8 seconds) and 0.4 g (16 seconds) in both of the developing solution G and the developing solution H, respectively. By using these developing solutions F, G and H, with regard to the respective lithographic printing plates prepared by the development processing time of 8 seconds and 16 seconds at 22° C., printing endurance, background stain, ink receptivity, ink removability, and fingerprint stain were evaluated.

The printing endurance was evaluated by the number of sheets printed until fine line silver image was disappeared by carrying out printing up to 100,000 sheets. Background stain was evaluated the presence or absence of stain at the background at the 1000th sheet printing. Ink receptivity was evaluated by a number of printed sheets until good printed material could be obtained. Ink removable property was evaluated by mounting the lithographic printing plate on an offset rotary printing press, after placing ink on the plate surface, dampening solution was fed, and counting a number of printed sheets until ink stain at the non-image portion was disappeared. The results are shown in Table 1.

TABLE 1

| | Developing time | Printing endurance | Background stain | Ink receptivity | Ink removability |
|---|---|---|---|---|---|
| Developing solution F | 8 seconds | 50,000 sheets | None | 100 sheets | 80 sheets |
| | 16 seconds | 20,000 sheets | Present | 150 sheets | 130 sheets |
| Developing solution G | 8 seconds | 80,000 sheets | None | 30 sheets | 10 sheets |
| | 16 seconds | 100,000 sheets | None | 20 sheets | 10 sheets |
| Developing solution H | 8 seconds | 100,000 sheets | None | 10 sheets | 10 sheets |
| | 16 seconds | 100,000 sheets | None | 10 sheets | 10 sheets |

Moreover, with regard to the above-mentioned lithographic printing plates, fingerprint stain was also evaluated in the same manner as in Example 1. As a result, at the non-image portion of the printed material printed by the lithographic printing plate prepared by using the developing solution F, clear fingerprint stain was admitted, but in the lithographic printing plates prepared by using the developing solution G or H of the present invention, completely no stain was admitted.

As can be clearly seen from the above Example 4, by controlling dissolution of aluminum oxide by adding an alkaline earth metal to the developing solution and adding thiosulfate in an amount of 0.04 mol/liter or more, stable processing excellent in various printing characteristics and having wide development latitude can be realized.

Example 5

An A1050 type aluminum plate belt having a width of 1030 mm and a thickness of 0.24 mm was moved with a processing rate of 13 m/min and soaked in a 4% aqueous sodium hydroxide solution at 60° C. for 10 seconds, washed with water and then soaked in an indirect power-supply system electrolytic bath filled with 1.5% of hydrochloric acid and 2% of acetic acid at 30° C., and a single-phase alternating current with 40 A/dm² and 50 Hz was applied to the bath from a power source for 30 seconds to effect the surface electrolytic roughening treatment by an alternating current. Then, the belt was washed with water, soaked in a 6% aqueous nitric acid solution at 70° C. for 10 seconds to effect desmutting, washed with water and dried. Moreover, the belt was passed through a 20% sulfuric acid to effect anodization to prepare an aluminum support having an anodized film amount of 2.1 g/m² and a center line average roughness (Ra) of 0.5 μm.

On the aluminum support, a palladium sulfide nuclear solution was coated and then dried. An amount of palladium sulfide contained in a physical development nuclei layer was 3 mg/m².

As a protective colloid, alkali-treated gelatin was used. As a silver halide emulsion, a silver chloroiodobromide emulsion (AgBr: 15 mol % and AgI: 0.3 mol %) having an average particle size of 0.2 μm, with which 0.006 mmol of potassium hexachloroiridate (IV) per mole of silver was doped, was prepared by the control double jet method. Thereafter, the emulsion was subjected to flocculation and washed. Moreover, after sulfur-gold sensitization was applied to the emulsion, a stabilizer was added thereto, and then, spectrally sensitized by using 1.3 mg of a sensitizing dye represented by the following formula (B) per 1 g of silver.

(B)

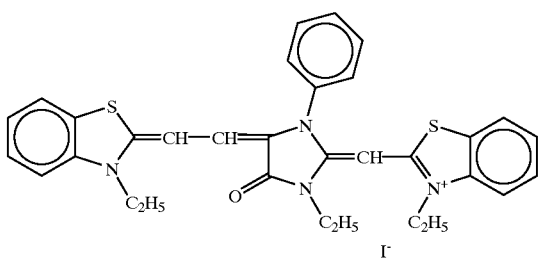

A surfactant was added to the thus prepared silver halide emulsion to prepare a coating solution. This coating solution for an emulsion layer was coated on the aluminum support on which the above-mentioned physical development nuclei had been coated, so that an amount of silver became 2 g/m$^2$ and a gelatin amount of 3 g/m$^2$, followed by drying to obtain a lithographic printing material sample.

On the thus prepared lithographic printing material, an image was outputted by an output machine having a red LD laser at 633 nm as a light source. Then, the lithographic printing material was processed by a processor for plate making (SLT-85N (trade name) automatic processor, available from Du'Pont) to obtain a lithographic printing plate. The processor for plate making is constitutedbya step of development processing (22° C., 15 seconds soaking), a step of washing processing (washing off the emulsion layer by a scrub roller while showering and jetting a washing solution at 35° C. for 10 seconds), a step of finishing processing (21° C., 5 seconds showering) and a drying step.

As the developing solutions, the following five kinds of developing solutions were used and the development processing was carried out by changing the soaking time.
<Developing Solution I> (Comparative purpose)

| | |
|---|---|
| Sodium hydroxide | 25 g |
| Copolymer of polystyrenesulfonic acid and maleic anhydride (Average molecular weight: 500,000) | 10 g |
| Anhydrous sodium sulfite | 100 g |
| Monomethylethanolamine | 50 g |
| 2-Mercapto-5-n-heptyl-oxadiazole | 0.5 g |
| Sodium thiosulfate (pentahydrate) | 20 g |
| Hydroquinone | 15 g |
| 1-Phenyl-3-pyrazolidinone | 3 g |

Make up to 1,000 ml with addition of deionized water. A pH (25° C.)=13.4.
<Developing Solution J>
Calcium sulfate was added to the above-mentioned Developing solution I so that an amount of calcium becomes 7 mmol and ethylenediaminetetraacetic acid was added in an amount of 7 mmol as a chelating agent.
<Developing Solution K>
Calcium sulfate was added to the above-mentioned Developing solution I so that an amount of calcium becomes 7 mmol and aminotri (methylenephosphonic acid) pentasodium salt was added in an amount of 7 mmol as a chelating agent.
<Developing Solution L>
Calcium sulfate was added to the above-mentioned Developing solution I so that an amount of calcium becomes 7 mmol and dihydroxyethylethylenediaminediacetic acid was added in an amount of 9 mmol as a chelating agent.

<Developing Solution M>
Calcium sulfate was added to the above-mentioned Developing solution I so that an amount of calcium becomes 7 mmol and triethylenetetraminehexaacetic acid was added in an amount of 6 mmol as a chelating agent.

Compositions of a washing solution and a finishing solution used in the processing are the same as used in Example 1.

Next, with regard to the printing plates prepared by using the above-mentioned developing solutions I to M, fine line reproducibility was tested by the method as mentioned below. Fine lines with a width of 50 μm and 100 μm were formed on the printing plates, and the fine line reproducibility was evaluated by the degree in which these fine lines were reproduced at the printed materials. Printing was each carried out by using a printer Heidelberg TOK (trade name, an offset printing press manufactured by Heidelberg Co.), ink (New Champion Black H, trade name, produced by Dainippon Ink Co., Japan) and commercially available dampening solution for a PS plate. The results are shown in Table 2. In Table 2, among the reproduced fine lines reproduced at the printed materials, narrower fine line is shown. Accordingly, the results show that the finer line width is excellent.

At the same time, ink removable property and fingerprint stain were evaluated in the same manner as in Example 1. The results are also shown in Table 2.

TABLE 2

| Develop- ing solution | Fine line reproducibility | | | | Ink remov- ability | Finger- print stain | Remarks |
|---|---|---|---|---|---|---|---|
| | 10 sec. | 12 sec. | 14 sec. | 16 sec. | | | |
| I | 50 | — | — | — | 100 sheets | Present | Comparative |
| J | 50 | 50 | 100 | — | 20 sheets | None | This invention |
| K | 50 | 50 | 50 | 50 | 20 sheets | None | This invention |
| L | 50 | 50 | 50 | 100 | 20 sheets | None | This invention |
| M | 50 | 50 | 50 | 50 | 20 sheets | None | This invention |

In the table, "—" represents that both of fine lines cannot be reproduced.

As can be clearly seen form the above results, in the present invention in which calcium (an alkaline earth metal) and a chelating agent thereof are added to the developing solution, development latitude, ink removable property and fingerprint stain can be markedly improved.

Example 6

An aluminum support prepared in the same manner as in Example 1 was used.

As physical development nuclei, a nuclei solution (A) disclosed in Japanese Provisional Patent Publication No. 208843/1988 was prepared in accordance with the preparation method disclosed therein and a pH thereof was adjusted to 6.8. This physical development nuclei solution was coated on the above-mentioned aluminum support and dried.

A silver halide emulsion was prepared in the same manner as in Example 1, and coated on the above-mentioned aluminum support on which the physical development nuclei layer had been coated, so that an amount of silver became 2 g/m$^2$ and a gelatin (alkaline treated gelatin) amount of 3 g/m$^2$, followed by drying to obtain a lithographic printing material.

On the above-mentioned lithographic printing material, an image was outputted by an output machine having a red LD laser at 633 nm as a light source. Then, the lithographic printing material was processed by a processor for plate making (SLT-85N (trade name) automatic processor, available from Du'Pont) to obtain a lithographic printing plate. The processor for plate making is constituted by a step of development processing (22° C., 15 seconds soaking), a step of washing processing (washing off the emulsion layer by a scrub roller while showering and jetting a washing solution at 33° C. for 12 seconds), a step of finishing processing (21° C., 5 seconds showering) and a drying step. The washing processing of the processor for plate-making is constituted by a tank storing 30 liters of a washing solution, a unit for supplying the solution from the tank to the lithographic printing material through a pump to peel off and remove the emulsion layer and a unit for circulating washing water passing through a filtration filter provided out of the system through the tank. As the filtration filter, cylindrical shape filter with a size of 5 µm was used.

By using the following developing solution, washing solution and finishing solution, 100 plates were processed with a A2 size paper.

<Developing Solution>

| | |
|---|---|
| Sodium hydroxide | 20 g |
| Hydroquinone | 20 g |
| 1-Phenyl-3-pyrazolidinone | 2 g |
| Anhydrous sodium sulfite | 80 g |
| Monomethylethanolamine | 6 g |
| Anhydrous sodium thiosulfate | 6 g |
| Calcium sulfate | 7 mmol |
| Aminotri(methylenephosphonic acid) | 3.5 g |
| Polyethylene glycol (average molecular weight 400) | 10 g |

Make up to 1,000 ml with addition of deionized water. A pH was adjusted to 13.0.

<Washing Solution A>

| | |
|---|---|
| Potassium primary phosphate | 40 g |
| Anhydrous sodium sulfite | 10 g |
| Monoethanolamine | 10 g |
| 2-Mercapto-5-n-heptyl-oxadiazole | 0.5 g |
| Proteinase (Bioprase AL-15, trade name) | 1 g |

Make up to 1,000 ml with addition of deionized water. A pH was adjusted to 6.9.

<Washing Solution B>

| | |
|---|---|
| Anhydrous sodium sulfite | 8 g |
| Triethanolamine | 20 g |
| 2-Mercapto-5-n-heptyl-oxadiazole | 0.5 g |
| Proteinase (Bioprase AL-15, trade name) | 1 g |

Make up to 1,000 ml with addition of deionized water. A pH was adjusted to 6.9.

<Washing Solution C>

To the above washing solution B was added 20 g of the phosphonic acid compound represented by the formula (5).

<Finishing Solution>

| | |
|---|---|
| Gum Arabic | 10 g |
| 2-Mercapto-5-n-heptyl-oxadiazole | 1 g |
| Triethanolamine | 26 g |
| Potassium primary phosphate | 10 g |

Make up to 1,000 ml with addition of deionized water. A pH was adjusted to 6.0.

With regard to the 100th plates of these lithographic printing plates prepared by the above-mentioned method, printing was each carried out by using a printer Heidelberg MO (trade name, an offset printing press manufactured by Heidelberg Co., attached with Alcolor water-feeding device), ink (New Champion Black H, trade name, produced by Dainippon Ink Co., Japan) and commercially available dampening solution for a PS plate to evaluate ink receptivity. As a result, in the lithographic printing plates treated by the washing solutions B and C, ink receptivities thereof were good since a number of sheets until good printed material can be obtained was 20 sheets less as compared with that of the lithographic printing plate treated by the washing solution A.

Also, in the above-mentioned plate-making treatment, adhered state of precipitates to a roller in the washing step of the processor for plate-making was observed. No precipitates was adhered to the roller in the lithographic printing plate prepared by using the washing solution C.

Example 7

Experiments were carried out in the same manner as in Example 4 except for using the following developing solution.

<Developing Solution G> (Comparative purpose)

| | |
|---|---|
| Sodium hydroxide | 30 g |
| Copolymer of polystyrenesulfonic acid and maleic anhydride (Average molecular weight: 500,000) | 10 g |
| Ethylenediaminetetraacetic acid sodium salt | 2 g |
| Anhydrous sodium sulfite | 100 g |
| Monomethylethanolamine | 50 g |
| 2-Mercapto-5-n-heptyl-oxadiazole | 0.5 g |
| Sodium thiosulfate (pentahydrate) | 8 g |
| Hydroquinone | 15 g |
| 1-Phenyl-3-pyrazolidinone | 3 g |

Make up to 1,000 ml with addition of deionized water. A pH (25° C.)=13.3.

<Developing Solution O>

| | |
|---|---|
| Sodium hydroxide | 30 g |
| Copolymer of polystyrenesulfonic acid and maleic anhydride (Average molecular weight: 500,000) | 10 g |
| Anhydrous sodium sulfite | 100 g |
| Monomethylethanolamine | 50 g |
| 2-Mercapto-5-n-heptyl-oxadiazole | 0.5 g |
| Sodium thiosulfate (pentahydrate) | 8 g |
| Hydroquinone | 15 g |
| 1-Phenyl-3-pyrazolidinone | 3 g |
| Calcium sulfate | 7 mmol |
| Aminotri(methylenephosphonic acid) | 5 g |

Make up to 1,000 ml with addition of deionized water. A pH (25° C.)=13.3.

<Developing Solution P>

The same composition as in Developing solution O except for adding 0.8 g of 1-phenyl-5-mercaptotetrazole.

When the above-mentioned lithographic printing materials were subjected to developing treatment at 22° C. for 8 seconds or 16 seconds by using the developing solution N, O or P, decreased amounts of the aluminum oxide per 1 m$^2$ were 0.8 g (8 seconds) and 1.1 g (16 seconds) in the developing solution N, and 0.3 g (8 seconds) and 0.4 g (16 seconds) in both of the developing solution O and the developing solution P, respectively. By using these developing solutions N, O and P, with regard to the respective lithographic printing plates prepared by the development processing time of 8 seconds and 16 seconds at 22° C., printing endurance, background stain, ink receptivity, ink removability, and fingerprint stain were evaluated.

The printing endurance was evaluated by the number of sheets printed until fine line silver image was disappeared by carrying out printing up to 100,000 sheets. Background stain was evaluated the presence or absence of stain at the background at the 1000th sheet printing. Ink receptivity was evaluated by a number of printed sheets until good printed material could be obtained. Ink removable property was evaluated by mounting the lithographic printing plate on an offset rotary printing press, after placing ink on the plate surface, dampening solution was fed, and counting a number of printed sheets until ink stain at the non-image portion was disappeared. The results are shown in Table 3.

TABLE 3

|  | Developing time | Printing endurance | Background stain | Ink receptivity | Ink removability |
|---|---|---|---|---|---|
| Developing solution N | 8 seconds | 50,000 sheets | None | 100 sheets | 80 sheets |
|  | 16 seconds | 20,000 sheets | Present | 150 sheets | 130 sheets |
| Developing solution O | 8 seconds | 100,000 sheets | None | 20 sheets | 15 sheets |
|  | 16 seconds | 100,000 sheets | None | 15 sheets | 15 sheets |
| Developing solution P | 8 seconds | 100,000 sheets | None | 5 sheets | 10 sheets |
|  | 16 seconds | 100,000 sheets | None | 5 sheets | 10 sheets |

Moreover, with regard to the above-mentioned lithographic printing plates, fingerprint stain was also evaluated in the same manner as in Example 1. As a result, at the non-image portion of the printed material printed by the lithographic printing plate prepared by using the developing solution N, clear fingerprint stain was admitted, but in the lithographic printing plates prepared by using the developing solution O or P of the present invention, completely no stain was admitted.

Example 8

An aluminum plate having a thickness of 0.30 mm which had been subjected to electrolytic roughening treatment and anodization was obtained. This aluminum plate had 2.5 g of porous aluminum oxide per 1 m$^2$ and an average roughness (Ra) of 0.6 μm.

In the same manner as in Example 7, a lithographic printing material was obtained except for using a silver chloroiodobromide emulsion containing 15 mol % of silver bromide and 0.3 mol % of silver iodide to which 100 mg of 1-phenyl-5-mercaptotetrazole had been added per mole of silver halide.

By using the developing solutions N, O and P prepared in Example 7, lithographic printing plates were prepared and printing was carried out by using the prepared plates. The results are shown in Table 4.

TABLE 4

|  | Developing time | Printing endurance | Background stain | Ink receptivity | Ink removability |
|---|---|---|---|---|---|
| Developing solution N | 8 seconds | 60,000 sheets | None | 100 sheets | 70 sheets |
|  | 16 seconds | 30,000 sheets | Present | 150 sheets | 110 sheets |
| Developing solution O | 8 seconds | 100,000 sheets | None | 15 sheets | 15 sheets |
|  | 16 seconds | 100,000 sheets | None | 10 sheets | 15 sheets |
| Developing solution P | 8 seconds | 100,000 sheets | None | 5 sheets | 10 sheets |
|  | 16 seconds | 100,000 sheets | None | 5 sheets | 10 sheets |

Example 9

By using the aluminum support prepared in the same manner as in Example 1 and the aluminum support as mentioned below, lithographic printing plates were prepared according to the procedure of Example 1. Two kinds of the lithographic printing plates were examined in the same manner as in Example 1 and Example 2.

<Aluminum Support>

According to Example 1 of U.S. Pat. No. 5,405,730, an aluminum support having the surface area of subsidences of at least 90% based on the total surface area was prepared.

As a result of the printing tests, when the above two kinds of the printing plates were subjected to developing treatment by using a developing solution containing calcium, all of ink removable property, fingerprint stain and fine line reproducibility of these plates were excellent. Particularly, with regard to printing endurance, they were possible to effect printing until 150,000 sheets.

Example 10

An A1050 type aluminum plate belt having a width of 1030 mm and a thickness of 0.24 mm was moved with a processing rate of 13 m/min and soaked in a 4% aqueous sodium hydroxide solution at 60° C. for 10 seconds, washed with water and then soaked in an indirect power-supply system electrolytic bath filled with 1.5% of hydrochloric acid and 2% of acetic acid at 30° C., and a single-phase alternating current with 50 A/dm$^2$ and 50 Hz was applied to the bath from a power source for 40 seconds to effect the surface electrolytic roughening treatment by an alternating current. Then, the belt was washed with water, soaked in a 6% aqueous nitric acid solution at 70° C. for 10 seconds to effect desmutting, washed with water and dried. Moreover, the belt was passed through a 20% sulfuric acid to effect anodization by changing the current density to prepare aluminum supports having a different aluminum oxide amount (an anodized film amount) as mentioned below. The center line average roughnesses (Ra) of these supports are all 0.55 μm.

Aluminum support 1: an aluminum oxide amount of 3.2 g/m$^2$

Aluminum support 2: an aluminum oxide amount of 2.5 g/m$^2$

Aluminum support 3: an aluminum oxide amount of 1.8 g/m$^2$

Aluminum support 4: an aluminum oxide amount of 1.2 g/m²

On the above-mentioned aluminum supports, a palladium sulfide nuclear solution was coated and then dried. An amount of palladium sulfide contained in a physical development nuclei layer was 3 mg/m².

As a protective colloid, alkali-treated gelatin was used. As a silver halide emulsion, a silver chloroiodobromide emulsion (AgBr: 15 mol % and AgI: 0.4 mol %) having an average particle size of 0.2 μm with which 0.006 mmol of potassium hexachloroiridate (IV) per mole of silver was doped, was prepared by the control double jet method. Thereafter, the emulsion was subjected to flocculation and washed. Moreover, after sulfur-gold sensitization was applied to the emulsion, a stabilizer was added thereto, and then, spectrally sensitized by using 3 mg of a sensitizing dye having an absorption maximum at the red region per 1 g of silver.

A surfactant was added to the thus prepared silver halide emulsion to prepare a coating solution. This coating solution for an emulsion layer was coated on the aluminum support on which the above-mentioned physical development nuclei had been coated, so that an amount of silver became 2.2 g/m² and a gelatin amount of 2.5 g/m², followed by drying to obtain a lithographic printing materials 1 to 4.

The thus prepared lithographic printing materials 1 to 4 were treated in the same manner as in Example 1 by using the developing solution A (Comparative) of Example 1 and the developing solution B (the present invention) of Example 2, respectively. Provided that the processing was carried out by changing the development time.

The thus obtained lithographic printing plates were simultaneously mounted on a printer Heidelberg TOK (trade name, an offset printing press manufactured by Heidelberg Co.), and printing is carried out by using ink (New Champion Black H, trade name, produced by Dainippon Ink Co., Japan) and commercially available dampening solution for a PS plate to evaluate development latitude. The development latitude was evaluated by the development time when a fine line with 50 μm cannot be reproduced. The longer development time means the development latitude being wide.

Also, the development time until when etch pit was generated was tested. The longer development time means the results being excellent. The results are shown in Table 5.

TABLE 5

| Printing plate | Developing solution | Development latitude | Etch pit | Remarks |
| --- | --- | --- | --- | --- |
| 1 | A | 13 seconds | 15 seconds | Comparative |
| 2 | A | 12 seconds | 13 seconds | Comparative |
| 3 | A | 11 seconds | 12 seconds | Comparative |
| 4 | A | 10 seconds | 11 seconds | Comparative |
| 1 | C | 16 seconds | 25 seconds | This invention |
| 2 | C | 16 seconds | 25 seconds | This invention |
| 3 | C | 16 seconds | 25 seconds | This invention |
| 4 | C | 16 seconds | 25 seconds | This invention |

As can be seen from the above results, by adding calcium (alkaline earth metal) to the developing solution, even when an aluminum amount of the support is reduced, wide development latitude can be obtained and occurrence of etch pit can be controlled.

What is claimed is:

1. A process for making a lithographic printing plate, which comprises subjecting a lithographic printing material having physical development nuclei between an anodized aluminum support and a silver halide emulsion layer to imagewise exposure to light and then processing the lithographic printing material at least with a developing solution, wherein said developing solution contains 1 mmol or more of an alkaline earth metal per liter of the developing solution.

2. The process according to claim 1, wherein the lithographic printing plate has an aluminum support in which the total surface area of a depressed area is 50% or more based on the total surface area and the depressed area has a continuous depth of at least 0.5 μm.

3. The process according to claim 1, wherein the development is so carried out that a decreased amount of the aluminum oxide of the support after the process for making a lithographic printing plate is 0.6 g/m² or less.

4. The process according to claim 1, wherein said alkaline earth metal is calcium.

5. The process according to claim 1, wherein said developing solution contains the alkaline earth metal and a chelating agent thereof.

6. The process according to claim 1, wherein said developing solution contains 0.04 mol or more of a thiosulfate per liter of the developing solution.

7. The process according to claim 1, wherein the development is carried out in the presence of a tetrazole compound having a mercapto group.

8. The process according to claim 1, wherein an amount of aluminum oxide in the anodized aluminum support is 3.5 g/m² or less.

9. The process according to claim 1, wherein a ratio of an amount of aluminum oxide in the anodized aluminum support to a surface roughness of the support is 8 or less.

10. The process according to claim 1, wherein the lithographic printing plate has an anodized aluminum support having 500 or more of pits with a diameter of 0.03 to 0.30 μm per 100 square μm and an average diameter of the pits of 0.05 to 0.20 μm.

11. The process according to claim 1, wherein the lithographic printing plate is treated by a washing solution containing no phosphoric acid or containing 50 mmol/liter or less of phosphoric acid after the development process.

12. The process according to claim 11, wherein the washing solution further contains an amine compound and is adjusted to pH 4 to 9.

13. The process according to claim 12, wherein the amine compound is alkanolamine.

14. The process according to claim 13, wherein the washing solution further contains an acid compound having a phosphonic acid group.

* * * * *